(12) United States Patent
Pedersen et al.

(10) Patent No.: US 7,406,668 B1
(45) Date of Patent: Jul. 29, 2008

(54) METHODS FOR PRODUCING MAPPINGS OF LOGIC SUITABLE FOR FPGA AND STRUCTURED ASIC IMPLEMENTATIONS

(75) Inventors: Bruce Pedersen, Sunnyvale, CA (US); Jinyong Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 240 days.

(21) Appl. No.: 11/072,560

(22) Filed: Mar. 3, 2005

(51) Int. Cl.
*G06F 17/50* (2006.01)

(52) U.S. Cl. .............................. 716/3; 716/16; 716/17; 716/18

(58) Field of Classification Search ............. 716/16–18, 716/1, 3; 326/38, 40–41
See application file for complete search history.

(56) References Cited

U.S. PATENT DOCUMENTS

| | | | |
|---|---|---|---|
| 5,825,202 A | 10/1998 | Tavana et al. | |
| 5,874,834 A | 2/1999 | New | |
| 6,091,262 A | 7/2000 | New | |
| 6,094,065 A | 7/2000 | Tavana et al. | |
| 6,242,945 B1 | 6/2001 | New | |
| 6,490,707 B1 | 12/2002 | Baxter | |
| 6,515,509 B1 | 2/2003 | Baxter | |
| 6,526,563 B1 | 2/2003 | Baxter | |
| 2004/0111691 A1 | 6/2004 | Tan et al. | |
| 2004/0261052 A1 | 12/2004 | Perry et al. | |
| 2006/0139054 A1* | 6/2006 | Madurawe | 326/40 |
| 2007/0035329 A1* | 2/2007 | Madurawe | 326/40 |

OTHER PUBLICATIONS

"Lcell Wysiwyg Description for the Stratix II Family", Version 1.1, Altera Corporation, Mar. 22, 2004.

* cited by examiner

*Primary Examiner*—Paul Dinh
(74) *Attorney, Agent, or Firm*—Ropes & Gray LLP; Robert R. Jackson

(57) ABSTRACT

Implementation of a logic design in either an FPGA or a structured ASIC is facilitated by designing either type of implementation so that it takes into account the possible need to migrate the design to the other type of implementation. Portions of the design that are being considered for one type of implementation (e.g., FPGA implementation) are assessed for suitability and/or desirability based not only on their suitability/desirability in that one type of implementation, but also based on their suitability/desirability in the other type of implementation (e.g., structured ASIC implementation).

9 Claims, 9 Drawing Sheets

METHODS FOR PRODUCING MAPPINGS OF LOGIC SUITABLE FOR FPGA AND STRUCTURED ASIC IMPLEMENTATIONS

BACKGROUND OF THE INVENTION

This invention relates to methods of doing "ASIC-aware" technology mapping for FPGAs or the like. For example, these are methods whereby the logic module or logic element outputs of the FPGA version of a user's logic design are also made "visible" in a structured ASIC version of the design.

A field programmable logic device ("FPGA") typically includes a network of logic elements ("LEs"). Each LE typically contains an N-input look-up table ("LUT") that can select the logical output of one of $2^N$ configuration RAM bits ("CRAM bits"). By programming these bits appropriately, the LUT can be programmed to implement any logical function of N-inputs. The FPGA also contains programmable routing resources for connecting the inputs and outputs of LEs. Routing resources typically include routing muxes that are controlled by configuration bits. Thus, an FPGA has great flexibility, in that it can implement many different logic circuits simply by programming the configuration bits. However, a significant amount of the die area—and hence the device cost—comes from the circuitry needed to make the device configurable, e.g., the CRAM bits, the LUT circuitry, and the routing multiplexer circuitry.

A structured gate array is a mask-programmable logic device. Typically, it includes a uniform structure of "hard" logic elements ("HLEs"). These HLEs are typically multi-gate circuits that are much smaller than the programmable LEs of FPGAs, and implement simpler functions. These HLEs may be combined to form units called clusters of HLEs ("CHLEs"). An HLE is typically capable of implementing only some very simple two- or three-input functions, while a CHLE can implement functions of similar complexity to an N-input LUT. However, unlike a LUT, a CHLE with M inputs may be able to implement only a subset of all possible $2^M$ functions of those M inputs.

The inputs and outputs of CHLEs are connected together via metal wires defined by one or more custom routing mask layers. Here, "mask" refers to the lithographic mask used in the integrated circuit manufacturing process. Some of the custom mask layers may also affect the functionality of the CHLE itself, by making connections within the HLE (and controlling, e.g., whether the HLE implements an AND or OR gate).

A structured gate array is not field-programmable. Once a custom mask has been made and once a device has been fabricated using this custom mask, the logic implemented in the device is fixed. Such a device is called an application-specific integrated circuit ("ASIC") or, in this case, a "structured ASIC" because at least the rudiments of an array of HLEs are always present (in addition to the customized features provided by the custom mask layers). An ASIC is much smaller than an equivalent FPGA, but the custom mask layers can result in high non-recoverable engineering costs ("NREs"). Once manufactured, it is not possible to fix mistakes in an ASIC without again incurring these NRE costs.

Technology mapping refers to the steps by which a design engineering automation ("EDA") software tool converts a user's specification of a design into a netlist of logic elements. Typically, the user's representation of a design is specified as a network of logic gates (e.g., AND gates, OR gates, and register primitives). In the prior art, technology mapping to LEs (for FPGAs) and technology mapping to CHLEs (for structured ASICs) have used different methods. In the case of FPGAs, the algorithms typically included partitioning the user's netlist into cones of logic with N or fewer inputs (since a LUT can implement any function with N or fewer inputs). This is typically implemented using well-known algorithms for finding min-cuts in a graph. In the case ASICs, the algorithm is implemented using a predefined library of logical functions, each of which has a predefined mapping into a small network of one or more HLEs. Both methods then typically use these algorithm implementations inside a bottom-up greedy or dynamic programming algorithm that chooses the best cut or best HLE for each node in the user's netlist. The output netlist includes the LUTs corresponding to the best cut of each visible node, or the best HLE for each visible node (where a visible node is a node that feeds an output pin, or is any input to a LUT or HLE of another visible node). Both methods attempt to minimize an overall metric for the user's design, which is typically a combination of cost and netlist delay. The cost of a LUT is typically fixed, while the cost of a CHLE depends upon the number of HLEs it contains. Secondary cost metrics may also take into account such things as the total number of inputs to the LUT (e.g., in an attempt to minimize routing costs), or the exact library primitive chosen for the CHLE (e.g., some multi-HLE CHLE primitives may have better packing or routing characteristics).

It would be desirable for a programmable logic manufacturer to be able to offer both an FPGA and an equivalent structured ASIC device to its customers. This would allow customers to initially design for the FPGA device without incurring any NRE costs, but also, after their design is fully debugged and production has ramped up, to switch to the ASIC device to reduce their unit-device costs.

In order to make the conversion of a design from an FPGA to an ASIC as seamless as possible, it would be desirable to make the network of LEs and the network of CHLEs be as similar as possible. In particular, it would be desirable to have the visible nodes of the LE netlist also be visible in the CHLE netlist, and vice-versa, so that nodes with the same name and implementing the same functionality exist in both devices. This would simplify functional and timing verification between the two netlists. These verification steps are important to catch errors (which could occur in the FPGA to ASIC conversion) before incurring the large NRE cost due to mask and device manufacturing. The timing verification is particularly important, because the FPGA and ASIC devices will have different timing characteristics (with the internal delays of the ASIC typically being much less than those in the FPGA).

What is desired is an ASIC-aware technology mapper for an FPGA device, which takes the costs and visible nodes of both types of networks into account simultaneously.

SUMMARY OF THE INVENTION

In accordance with the invention, migration of a logic design between two types of implementation (e.g., from FPGA implementation to structured ASIC implementation or vice versa) is facilitated by selecting the portions of the design—into which the design will be subdivided for implementation—based on consideration of the suitability and/or desirability of various possible subdivisions for both types of implementation, not just the one type of implementation that is the presently immediate objective. The "suitability and/or desirability" criteria referred to in the preceding sentence may be referred to elsewhere herein as "cost," as a "metric," or the like. The "possible subdivisions" referred to in the earlier sentence may be referred to elsewhere herein as "candidate portions" of the logic design or the like.

The methods of the invention may include selecting possible subdivisions or candidate portions of the logic design that can be implemented in one predetermined unit of at least one of the possible target circuit implementations. For example, if the immediate target is an FPGA implementation, the predetermined unit may be one LE of the target FPGA architecture. The cost of a candidate portion is then determined from the cost of an FPGA implementation of that candidate portion and the cost of a structured ASIC implementation of that portion. The last of these costs (i.e., the structured ASIC implementation cost) may depend on such factors as (1) whether or not there is an already-known structured ASIC implementation of the candidate portion, and (2) if there is a known structured ASIC implementation, what amount of structured ASIC resources is required for that implementation, what is the packing efficiency of the ASIC implementation, etc. If there is no already-known structured ASIC implementation of the candidate portion, then the structured ASIC cost of implementing that candidate portion may be assigned a "penalty" value.

The relative cost of various candidate portions are compared to finally select how the logic design will be subdivided for implementation. For example, of various possible alternative candidate portions, the one with the lowest overall cost (including consideration of both FPGA and structured ASIC implementation cost) may be the one selected for implementation.

The foregoing methodology supports the possible need to migrate a design from one type of implementation to another in several ways. For example, because the cost of both types of implementations have been considered in the initial implementation, the cost of the alternative implementation cannot be excessive. In addition, the same circuit nodes will tend to be visible in both implementations (because the above costs are weighted in favor of candidate portions of the logic design that use known units of FPGA and structured ASIC circuitry, and especially those for which there are known structured ASIC implementations). Having the same nodes visible in both FPGA and structured ASIC implementations of a logic design greatly facilitates ensuring that these implementations will be functionally and operationally identical or as nearly identical as is desired.

Further features of the invention, its nature and various advantages, will be more apparent from the accompanying drawings and the following detailed description.

DETAILED DESCRIPTION

The principles of this invention are applicable to facilitating logic design migration between many different FPGA architectures, on the one hand, and many different structured ASIC architectures, on the other hand. The next several paragraphs will describe particular FPGA and structured ASIC architectures as one example of a context in which the invention can be applied. It will be understood, however, that these architectures are only illustrative, and that the invention is equally applicable in many other architectural contexts.

FPGA and structured ASIC architectures that can be used to provide equivalent, or very closely equivalent, alternative implementations of a user's logic design are shown in such references as Chua et al. U.S. patent application Ser. No. 10/884,460, filed Jul. 2, 2004, Yuan et al. U.S. patent application Ser. No. 10/916,305, filed Aug. 11, 2004, and Schleicher et al. U.S. patent application Ser. No. 11/050,607 filed Feb. 3, 2005. To facilitate understanding of the present invention without the need for reference to any other document, however, the next several paragraphs and related FIGS. 1-3 will provide background of the kind that can be gotten from the above-mentioned references.

Figure 1:
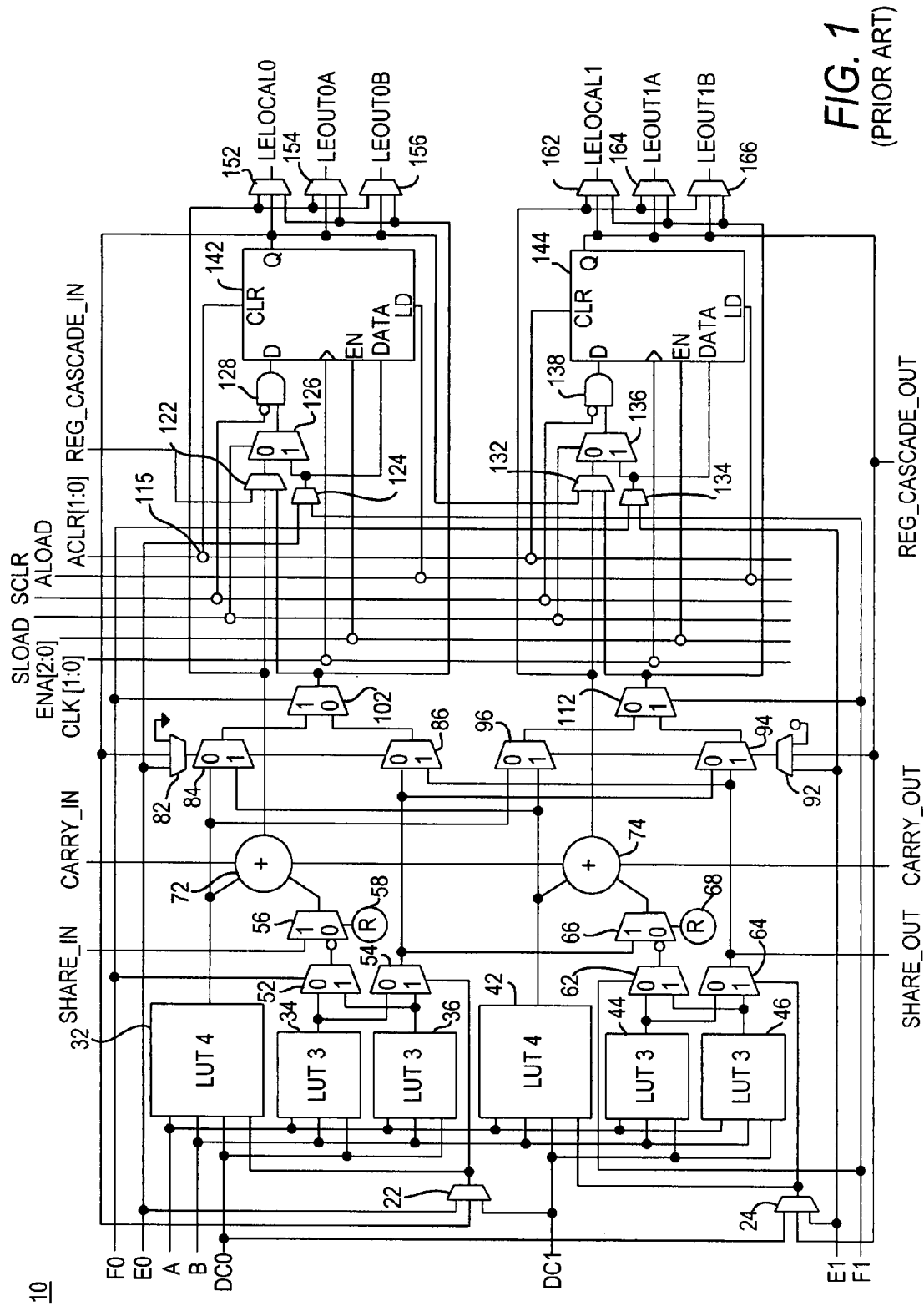
FIG. 1 is a simplified schematic block diagram of an illustrative basic unit of FPGA circuitry that is known to those skilled in the art.

An illustrative example of a basic logic circuit building block or unit 10 for inclusion in an FPGA is shown in FIG. 1. This FPGA building block circuitry (also sometimes referred to as a logic element ("LE"), a logic module ("LM"), an adaptive logic element ("ALE"), or an adaptive logic module ("ALM")) is known to those skilled in the art and can therefore be described in a somewhat abbreviated way herein. ALE 10 includes multiplexers 22, 24, 52, 54, 56, 62, 64, 66, 82, 84, 86, 92, 94, 96, 102, 112, 122, 124, 126, 132, 134, 136, 152, 154, 156, 162, 164, and 166. Most of these multiplexers are programmably controlled by programmable random access memory ("RAM" or "CRAM") bits that are generally not shown in the drawings (although RAM bits 58 and 68 in FIG. 1 are illustrative). Some of these multiplexers are more dynamically controlled by signals that can change during normal operation of the device. Multiplexer 112 is an example of this latter type of multiplexer. It is controlled by input F1 to ALE 10.

ALE 10 also includes look-up tables ("LUTs") 32, 34, 36, 42, 44, and 46. LUTs 32 and 42 are four-input look-up tables. The other LUTs are three-input look-up tables. Each of these LUTs is programmable to provide an output signal that is any logical combination of the input signals to that LUT.

Other components of ALE 10 are full adders 72 and 74, AND gates 128 and 138, and flip-flops 142 and 144. The conductor interconnections shown by open circles (e.g., connection 115) are programmable interconnections, which means that the interconnection may or may not be made, as desired by the user.

The LUT resources of ALE 10 are sufficient to enable the ALE to form any logical combination of up to six inputs to the ALE. Alternatively, if two somewhat smaller functions have some inputs in common, then the LUT resources of ALE 10 may be sufficient to perform two such functions. For example, it may be possible for an ALE 10 to form two five-input combinations, two four-input combinations, etc.

Full adders 72 and 74 enhance the arithmetic capabilities of ALE 10. For example, these components give ALE 10 the ability to perform two adjacent places of the binary addition of two numbers, including the handling of carry in and carry out signals.

Registers 142 and 144 (and associated circuitry) allow signals in ALE 10 to be either registered (by a register) or unregistered (bypassing a register). An ALE 10 register does not have to be used to register a signal originating in the ALE. A register can instead be used (in so-called lonely register mode) to register an input signal to the ALE. Other circuitry of the ALE can be used for other purposes while one or both of registers 142 and 144 are used in lonely register mode. Registers 142 and 144 are also capable of operating in different asynchronous or synchronous modes. "D" is the normal data input to each register; "DATA" is the asynchronous load data.

Figure 2:
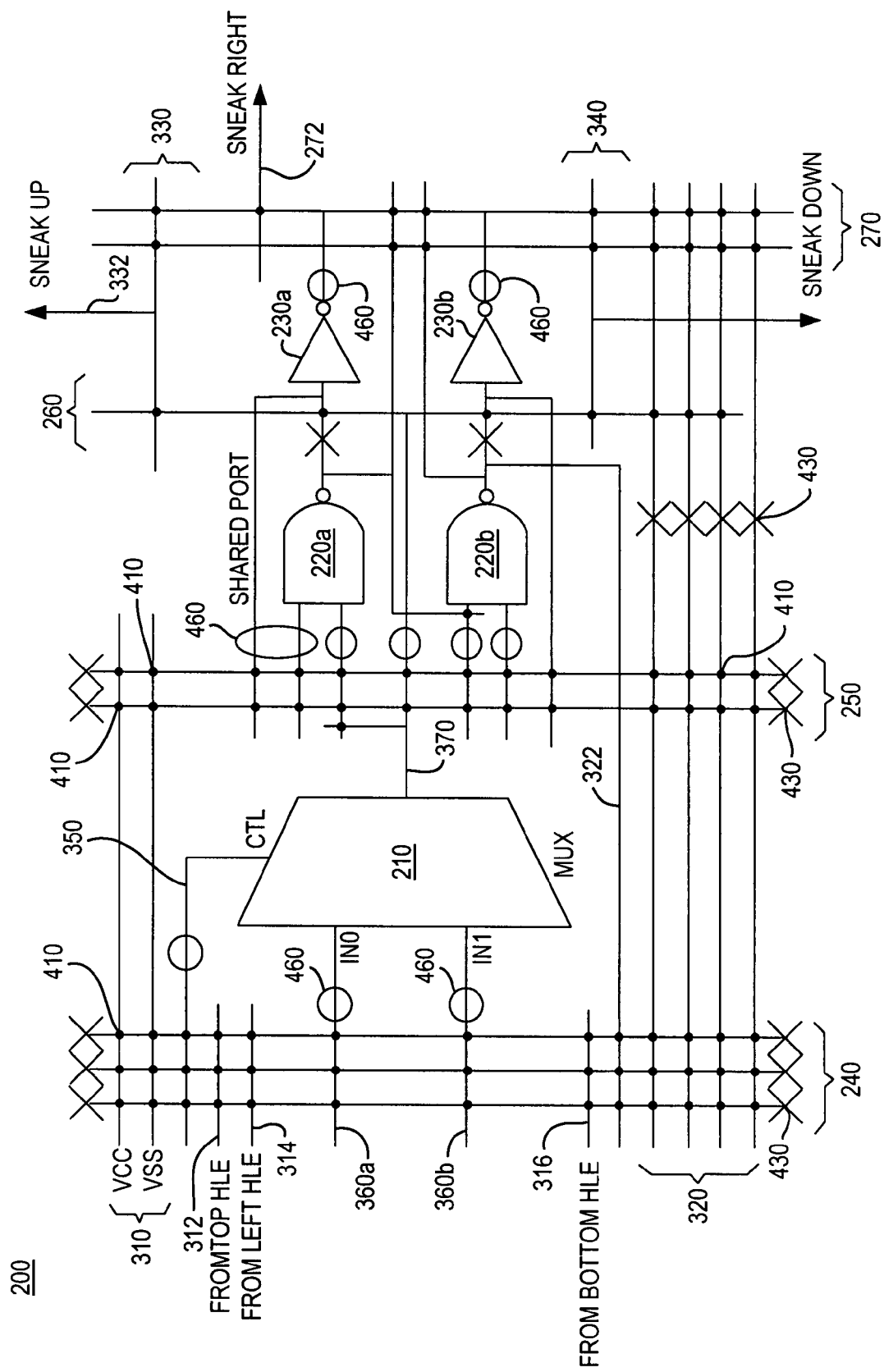
FIG. 2 is a simplified schematic block diagram of an illustrative basic unit of structured ASIC circuitry that is useful in explaining certain aspects of the invention.

FIG. 2 shows an example of a basic logic circuit building block or unit 200 for inclusion in a structured ASIC. FIG. 2 herein is the same as FIG. 3 in the above-mentioned Chua et al. reference. Accordingly, the description of FIG. 2 can be somewhat abbreviated herein. Building block 200 may also be referred to as a hybrid or hard logic element or HLE.

HLE 200 includes two-input multiplexer 210, NAND gates 220a and 220b, and inverters 230a and 230b. HLE 200 also includes some interconnection resources, some of which are mask programmable. For example, Xs identify locations at which conductor segments can be connected to one another or not, as desired, by appropriately customizing a mask (or masks) used to make the ASIC. Similarly, Os identify locations at which connections can be made, if desired, to one or more circuit layers (not shown) in which relatively long-distance interconnection conductors can be provided. Again, these connections and inter-connections are made by appropriately customizing one or more of the masks used to make the ASIC. The solid dots at conductor intersections in FIG. 2 are also connections that can be made or not made, as desired, between the intersecting conductors. Once again, these connections are made, if desired, by appropriately customizing one or more of the masks used to make the ASIC.

Figure 3:
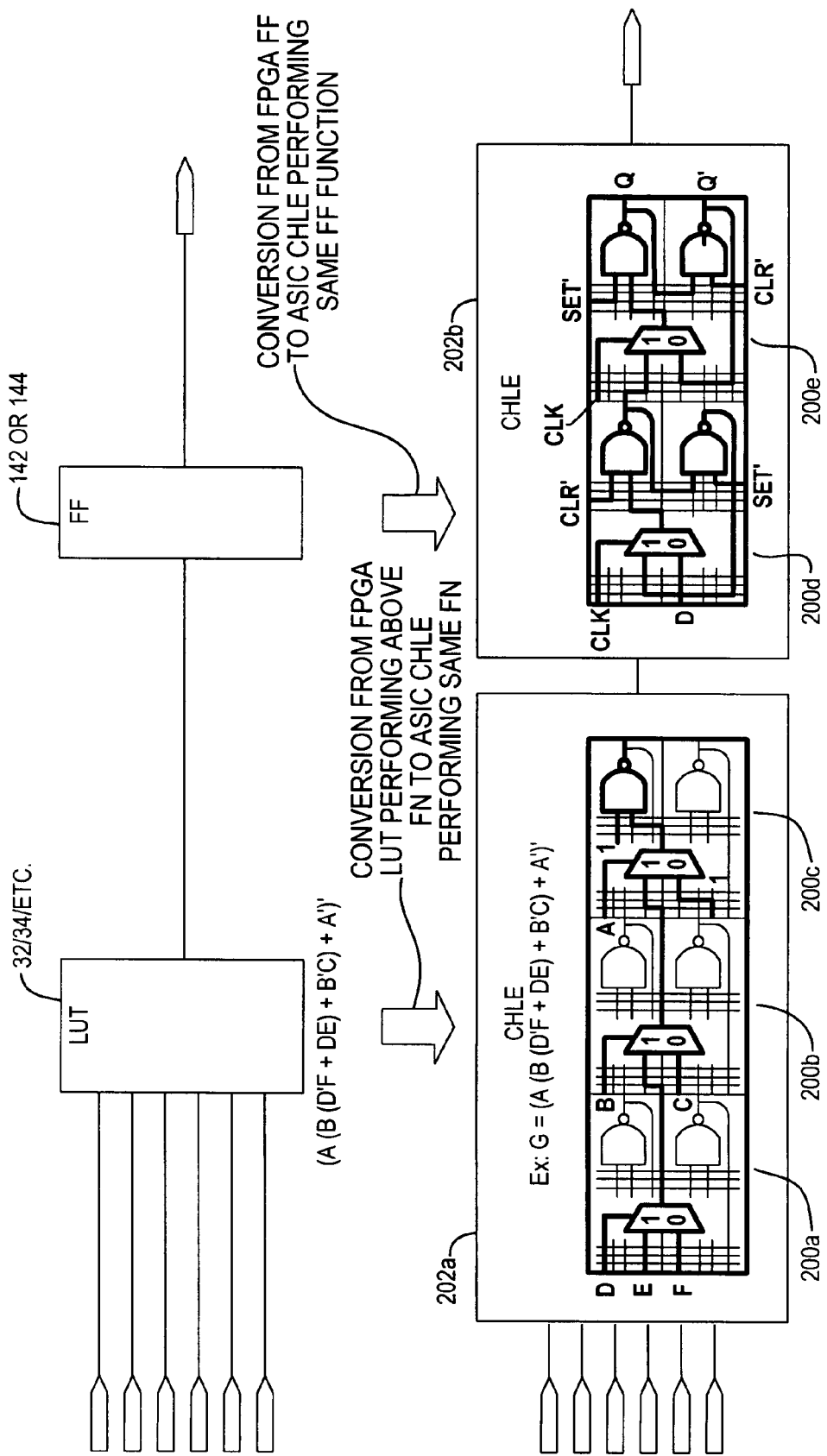
FIG. 3 is a simplified schematic block diagram showing equivalent implementations of certain illustrative circuit functions in FPGA and structured ASIC circuitry.

It will be apparent that the logic capabilities of HLE 200 are much less than the logic capabilities of ALE 10 (FIG. 1). However, a relatively small number of adjacent or nearby HLEs can generally be put together to perform any function(s) that an ALE is performing in a user's logic design that has been implemented in an FPGA. FIG. 3, for example, shows the equivalence between three HLEs 200a, b, and c and the LUT circuitry 32/34/ETC. of an ALE 10 performing a particular six-input logical combination. FIG. 3 also shows the equivalence between two more HLEs 200d and e and flip-flop circuitry 142 or 144 of an ALE 10 (which can be the same ALE as is performing the six-input logical combination shown in FIG. 3). It should be understood that HLEs 200a-e are shown greatly simplified in FIG. 3. For the most part only the HLE circuit elements and connections that are actually in use are shown in FIG. 3. All the other HLE circuitry that is shown in FIG. 2 is actually present in each HLE 200a-e, but some of this detail is omitted from the FIG. 3 depiction (or shown using lighter lines) to simplify FIG. 3. Multiple HLEs 200 that are used together (e.g., to perform combinational logic equivalent to what can be performed in LUT circuitry of an ALE, or to perform a register function equivalent to what can be performed in flip-flop circuitry of an ALE) may be referred to as a cluster of HLEs, a complex HLE, or a CHLE. FIG. 3 therefore shows two CHLEs 202a and 202b.

Although FIG. 3 shows migration of portions of an FPGA implementation of a user's logic design to a structured ASIC implementation of those same portions, it will be understood that the migration can alternatively be in the opposite direction (i.e., from a structured ASIC implementation to an FPGA implementation).

Figure 4A:
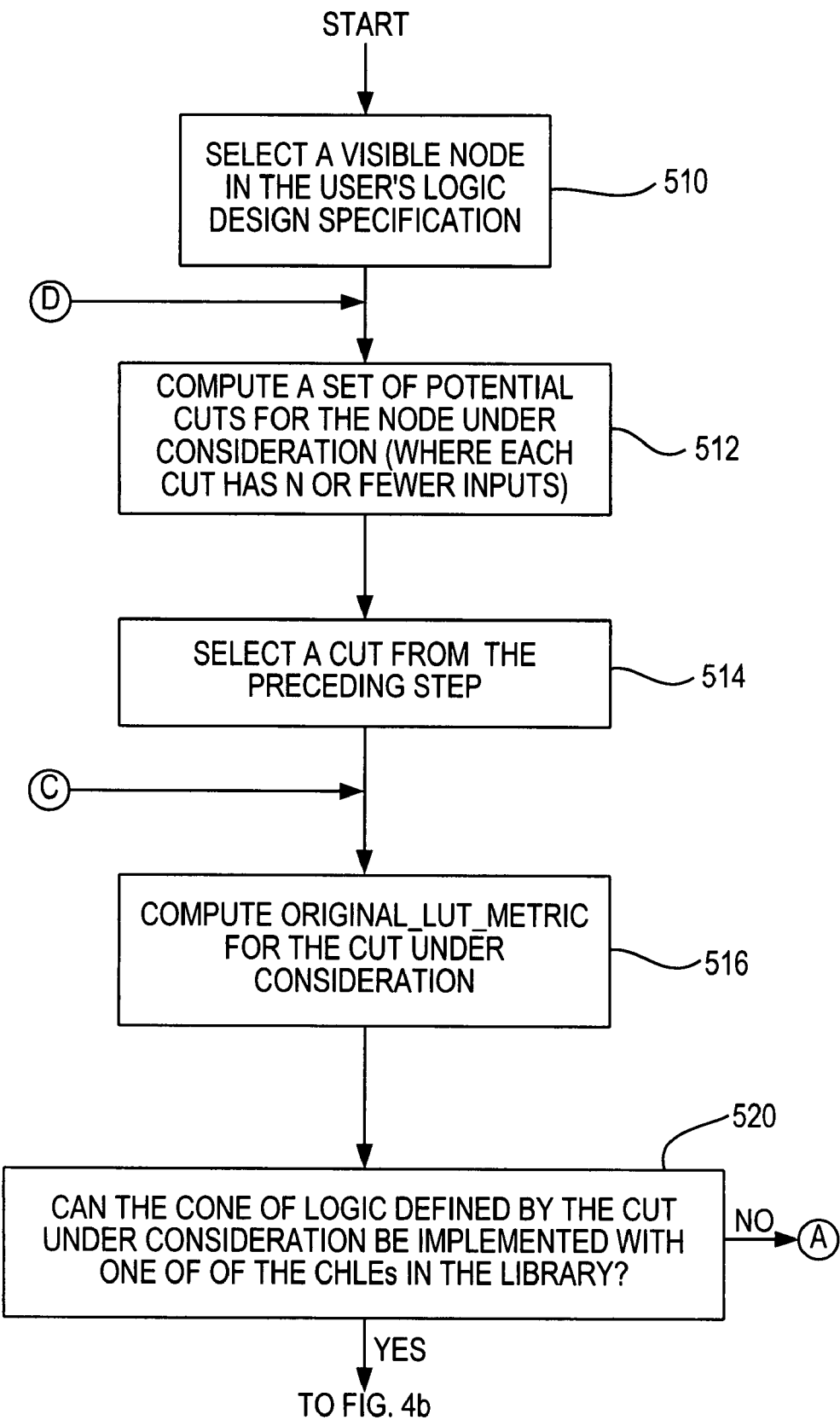
FIGS. 4a-4c collectively comprise a simplified flow chart of an illustrative embodiment of the invention.
Figure 4B:
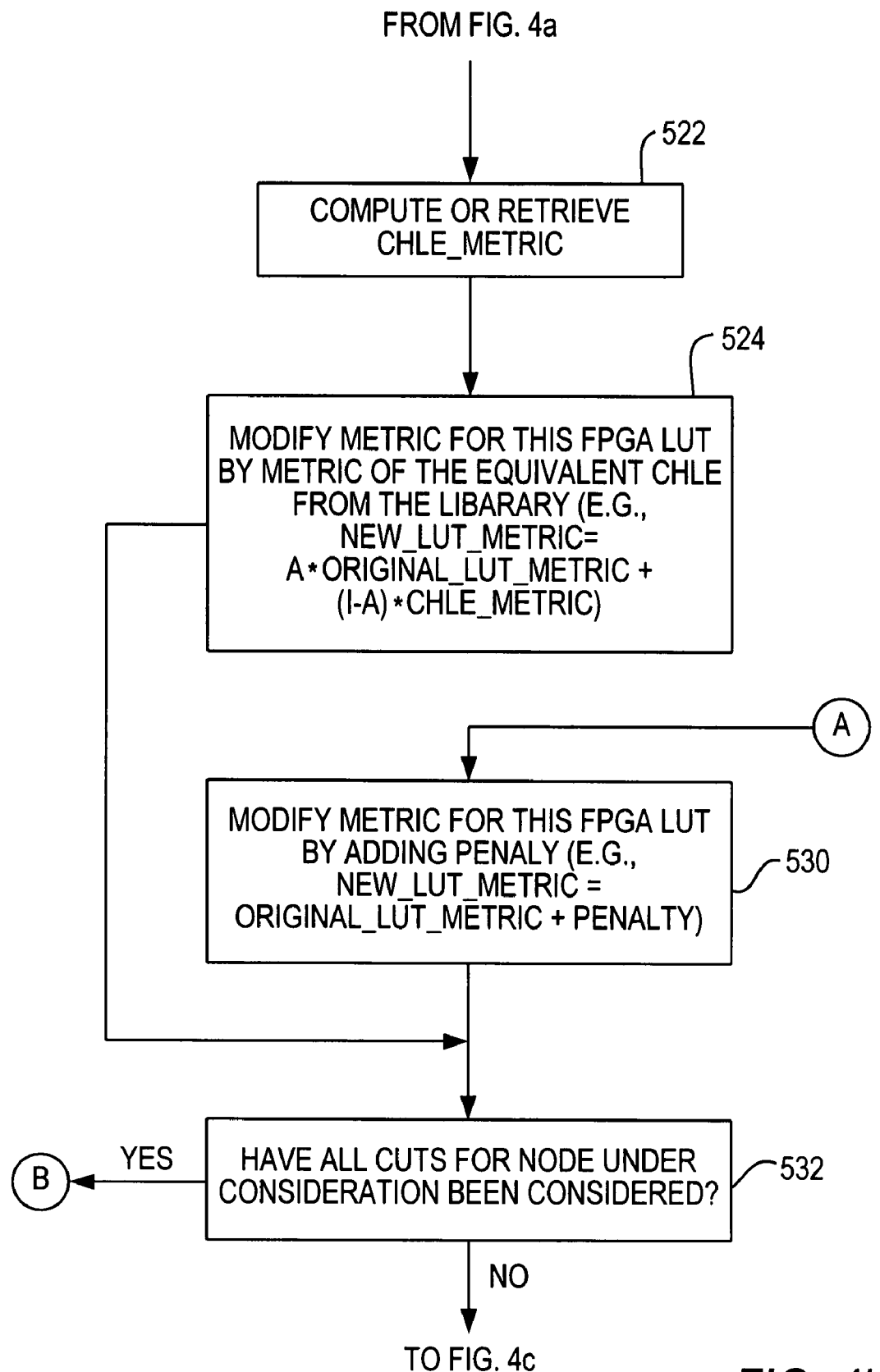
Figure 4C:
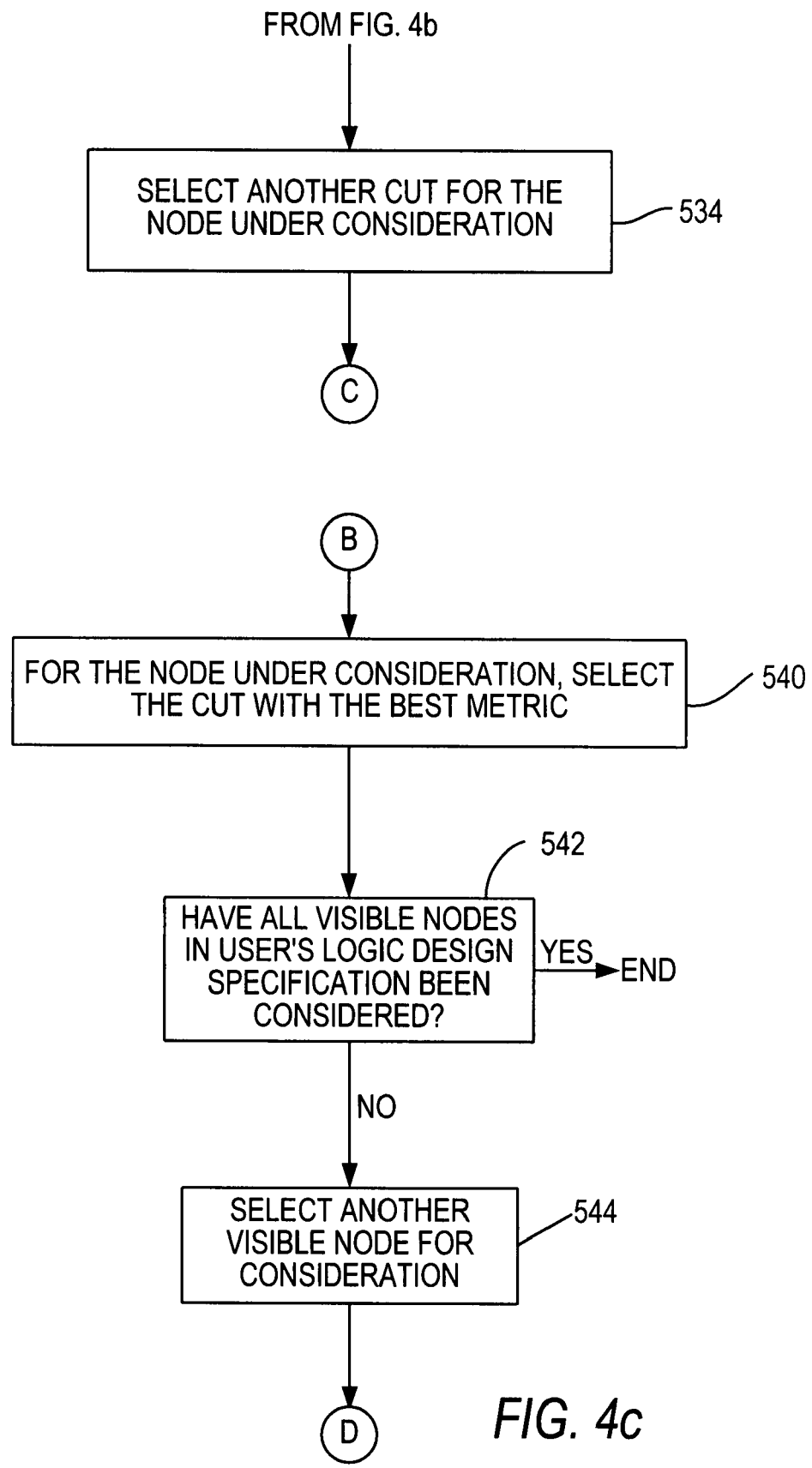
Figure 5A:
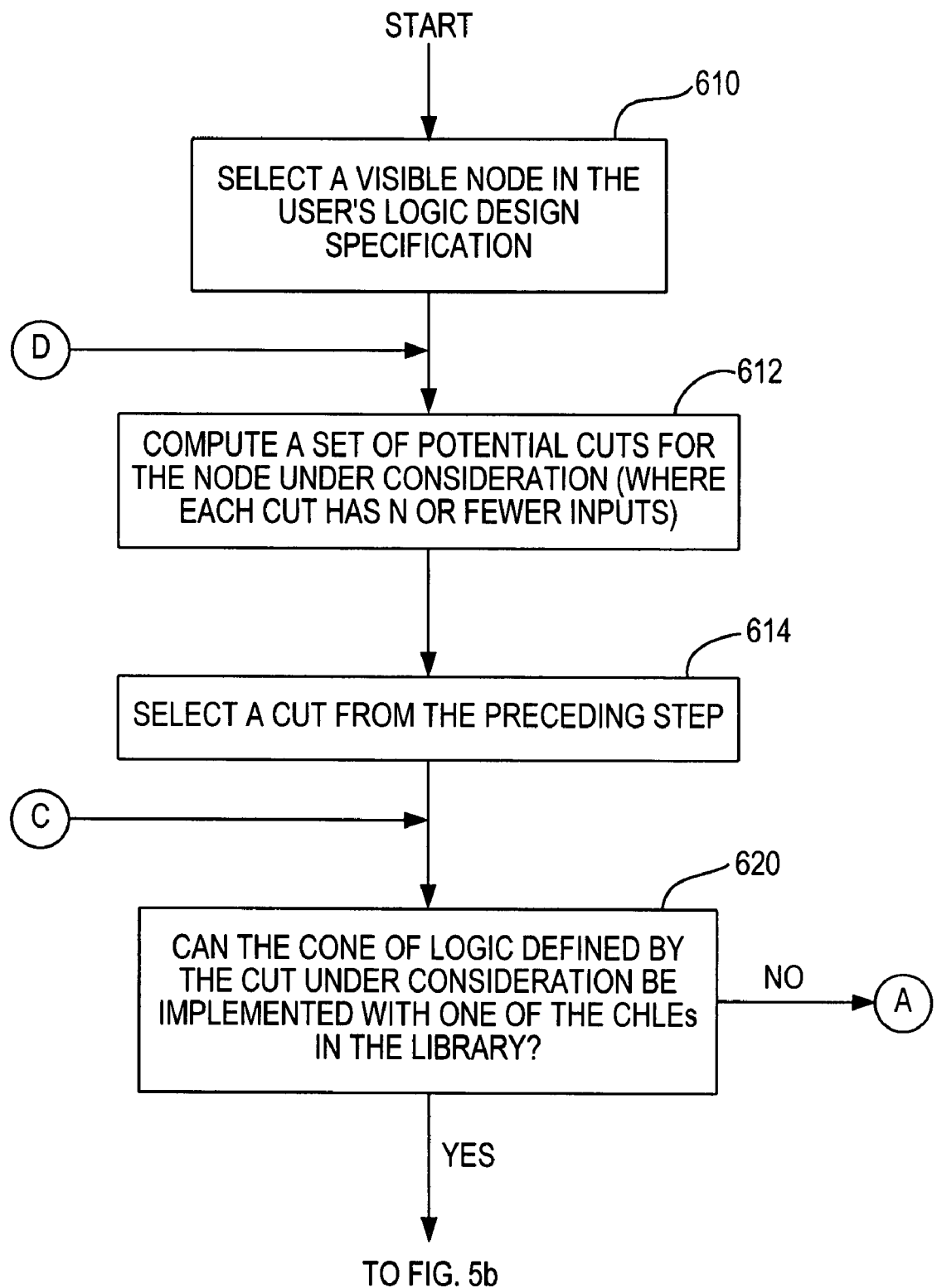
FIGS. 5a-5c collectively comprise a simplified flow chart of another illustrative embodiment of the invention.
Figure 5B:
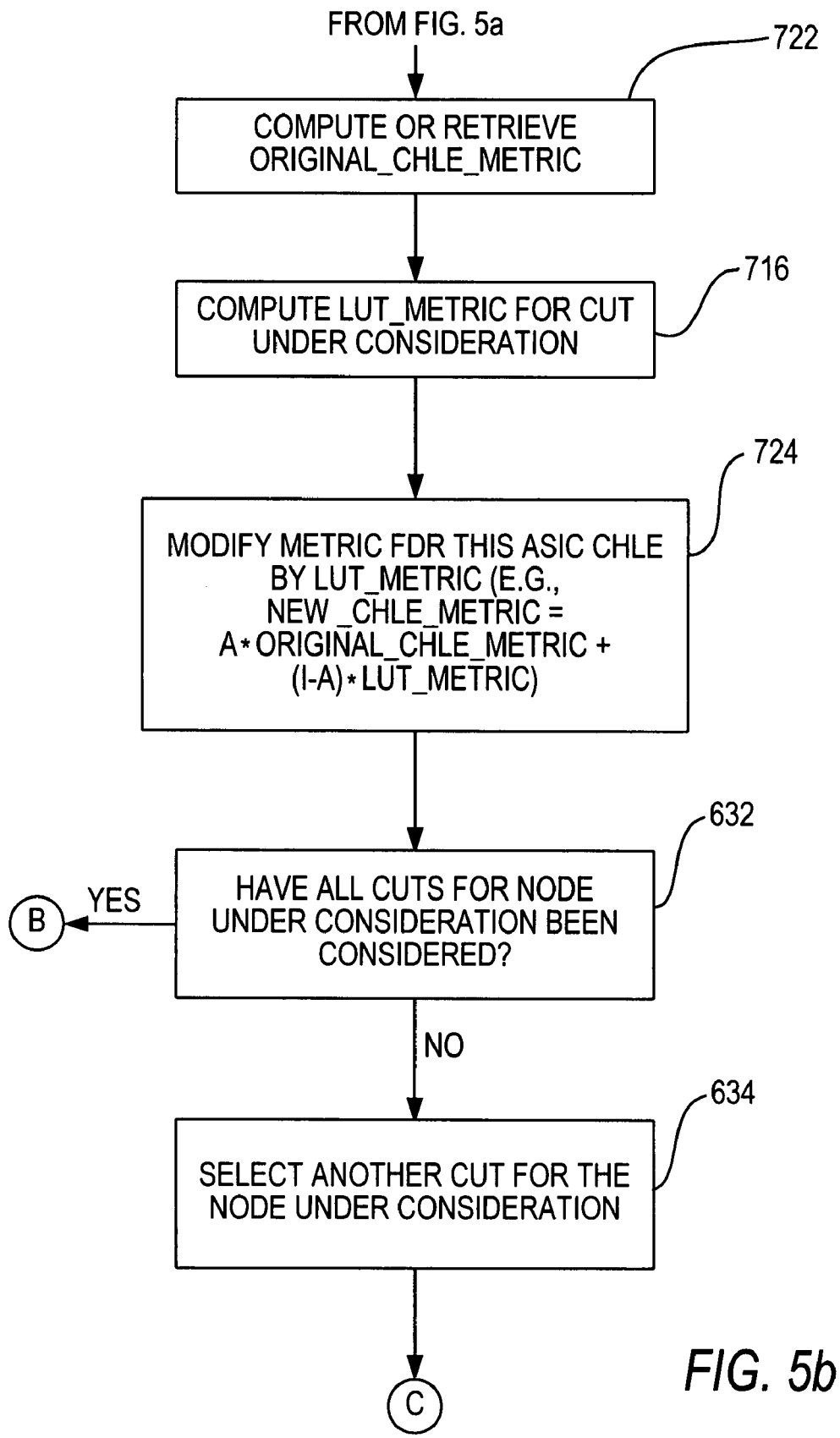
Figure 5C:
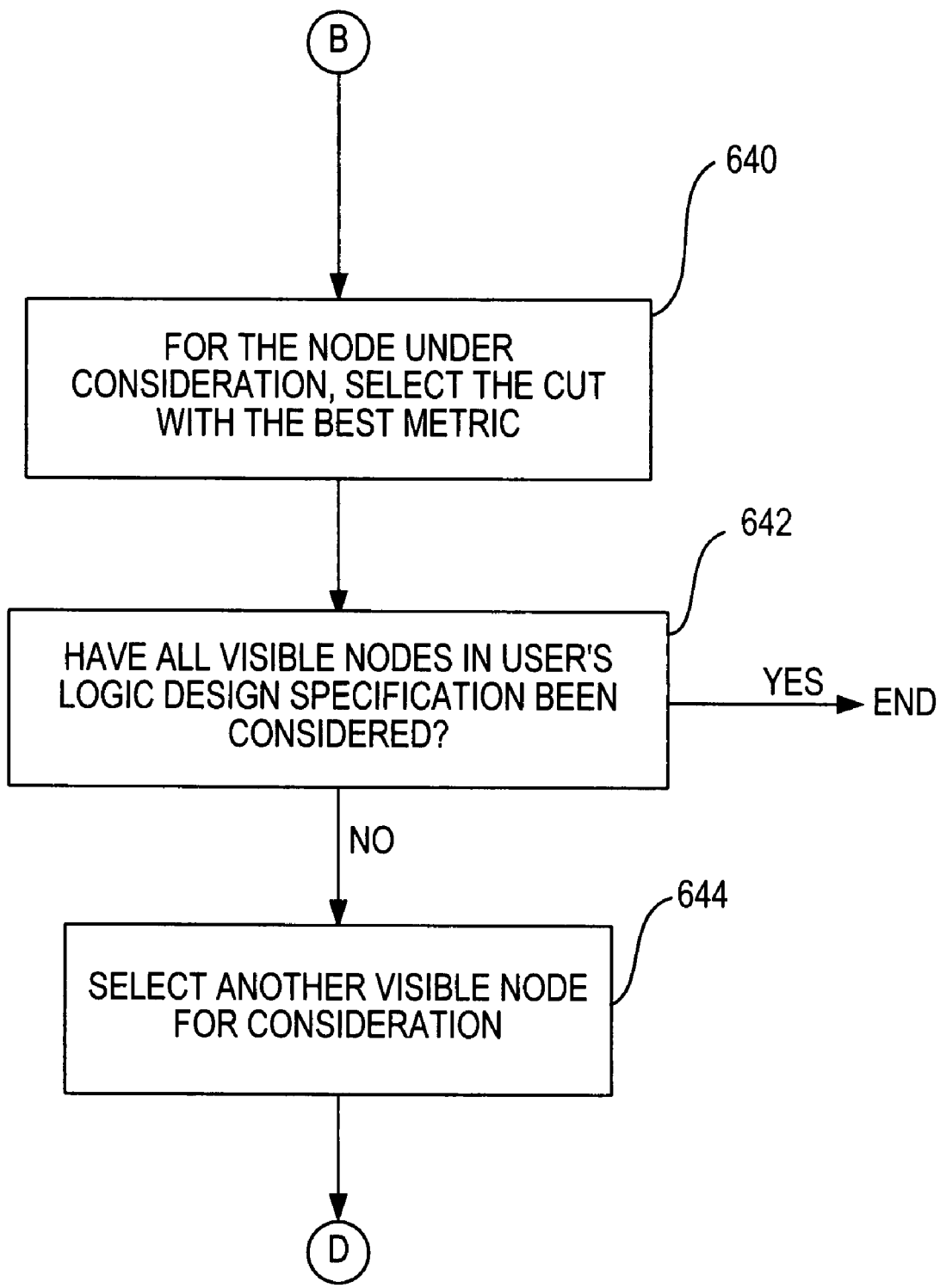

The present invention relates to facilitating migration of logic designs between FPGA and structured ASIC implementations such as those described illustratively above. FIGS. 4a-4c show an illustrative embodiment of the invention in which the immediate objective is mapping to an FPGA, but in which the FPGA mapping is done so as to facilitate possible migration of the result to a structured ASIC. FIGS. 5a-5c show an alternative embodiment that is somewhat the reverse, i.e., mapping to a structured ASIC as the immediate objective, but doing so in such a way that possible migration of the result to an FPGA is facilitated.

An illustrative embodiment of an FPGA technology mapping algorithm in accordance with the invention begins (in step 510; FIG. 4a) with selection of a first visible node in the user's logic design specification. As described earlier, a visible node is a node that feeds an output pin, or, in the case of an FPGA implementation of the user's logic design, is any input to a LUT in that FPGA implementation. Accordingly, because initially no LUTs have yet been selected for the FPGA implementation, the visible node selected in step 510 will typically be an output node in the user's logic design.

In step 512 a set of potential cuts for the node under consideration is computed using methods that are well known to those skilled in the art. For example, each cut may be a cone of logic having N or fewer inputs, where N is the maximum number of inputs that an FPGA LUT can have. A typical value for N is 6, but N can have any value that is appropriate for the particular FPGA architecture that has been selected for implementation of the user's logic design.

In step 514 a first of the cuts from step 512 is selected for further consideration.

In step 516 a "metric value" associated with implementing the cut under consideration in an FPGA LUT is computed. Elsewhere this LUT metric value is referred to by the parameter name ORIGINAL_LUT_METRIC. (It is assumed in this discussion that a relatively low metric value is "better" than a relatively high metric value. It will be understood, however, that any other consistent convention in this regard could be used instead if desired. Thus, for example, in an alternative embodiment higher values could be associated with "better" metrics.)

The step 516 computation of the ORIGINAL_LUT_METRIC value for the cut under consideration can be entirely conventional. As such, this computation may take into account several different "costs" and/or "benefits" of implementing the cut under consideration in an FPGA LUT. For example, a cut having a relatively small number of inputs (significantly less than N) may be regarded as relatively inefficient in terms of circuit resource utilization. Such a cut may therefore have a relatively high metric value. A cut with more inputs may have a lower metric value. On the other hand, a cut with maximum (N) inputs may be somewhat less favored than a cut with N−1 inputs because of the intense utilization of input routing resources that supporting the maximum number of inputs entails. Signal delay is another example of a characteristic that may be taken into account in the LUT metric value. Whatever the various criteria employed for assigning metric value to an FPGA LUT implementation of the cut under consideration, the computation of the ORIGINAL_LUT_METRIC value in step 516 takes those criteria into account.

In step 520 the logic associated with the cut being considered is examined to determine whether it can be implemented by one of the CHLEs in a library of known, structured ASIC CHLEs. If the cut can be implemented by a known CHLE, control passes from step 520 to step 522. If not, control passes from 520 to step 530. The branch to step 522 will be considered first (beginning with the next paragraph).

In step 522 the metric value for implementing the cut under consideration in a library CHLE is computed or retrieved from the data stored in the library in association with that CHLE. Elsewhere this CHLE metric value is referred to by the parameter name CHLE_METRIC. The metric value that a particular CHLE has may take into account such considerations as how many HLEs the CHLE includes, to what degree does the physical arrangement of the HLEs in the CHLE contribute to efficient packing of CHLEs in a structured ASIC device, etc. In general, more HLEs in a CHLE tends to use circuit resources more efficiently, because within a CHLE HLEs can be interconnected using "lower-cost" local connections rather than the "more expensive" connections that are generally used for inter-CHLE interconnections. Thus, the CHLE metric value tends to be lower for CHLEs that include more HLEs. Similarly, CHLEs in which the HLEs are arranged in a rectangle, a row, or a column may have a lower metric than CHLEs in which the HLEs form a T shape, a plus-sign shape, or another shape that is unlikely to contribute to dense and therefore efficient packing of CHLEs in a structured ASIC. Still other "cost" and/or "benefit" considerations may be reflected in the metric value of a CHLE. As has been mentioned, this value can be part of the data for each CHLE that is available in the library of known CHLEs. In that event, it is only necessary for step 522 to retrieve this metric value from the library data for the CHLE that step 520 finds can be used to implement the cut under consideration.

In step 524 the ORIGINAL_LUT_METRIC value for the cut under consideration (i.e., from the most recent performance of step 516) is modified by the CHLE_METRIC value for that cut (i.e., from the most recent performance of step 522). This FPGA LUT metric modification can be done in various ways. For example, step 524 shows an FPGA LUT metric modification that is a linear combination of the original FPGA LUT metric value and the CHLE metric value. This linear combination is formed using a weighting factor A for the original FPGA LUT metric (the parameter A having a value in the range from 0 to 1), and a complementary weighting factor 1-A for the metric of the logically equivalent CHLE. A typical value for A is 0.5, which gives equal weight to the original FPGA LUT metric and the logically equivalent ASIC CHLE metric in computing a new value (NEW_LUT_METRIC) for the metric of the FPGA LUT. This new FPGA LUT metric value will be used for the cut under consideration in all subsequent steps in the method being described.

The above-mentioned value of 0.5 for A is only an example, and other values can be used for A instead if desired. For example, a larger value of A gives more weight to ORIGINAL_LUT_METRIC in the step 524 computation of NEW_LUT_METRIC. A smaller value of A gives more weight to CHLE_METRIC in the step 524 computation of NEW_LUT_METRIC. Whatever the value of A employed (less than 1), the new metric (NEW_LUT_METRIC) for the FPGA LUT implementation of the cut under consideration is influenced to a greater or lesser degree (dependent on the value of A) by the metric of the logically equivalent ASIC CHLE implementation of that cut.

From step 524 control passes to step 532.

If in step 520 it is found that the cut under consideration has no known structured ASIC CHLE implementation, then control passes from step 520 to step 530.

In step 530, the metric for the FPGA LUT implementation of the cut under consideration (i.e., ORIGINAL_LUT_METRIC) is modified by a PENALTY value to produce a new metric for the FPGA LUT implementation of the cut (i.e., NEW_LUT_METRIC). Preferably, PENALTY increases ORIGINAL_LUT_METRIC by an amount sufficient to discourage the use of the cut under consideration if another cut is available that does have a CHLE implementation in the library of known CHLE implementations. This helps to push the FPGA implementation of the user's logic design toward use of cuts that have known, alternative, one-for-one, ASIC CHLE implementations, thereby greatly facilitating the provision of an ASIC equivalent of the user's FPGA implementation should that ever be desired.

From step 530 control passes to step 532.

In step 532 a test is performed to determine whether all cuts for the node under consideration have been dealt with. If not, control passes to step 534, in which another cut for the node under consideration is selected for processing. Control then returns to step 516, where processing of the next cut begins as described above for the preceding cut.

If step 532 determines that all cuts for the node under consideration have been processed, then control passes from step 532 to step 540.

In step 540 the cut with the best metric (i.e., the lowest value of NEW_LUT_METRIC) for the node under consideration is selected as the cut that will be implemented by an FPGA LUT in the FPGA implementation of the user's logic. Control then passes to step 542.

In step 542 a test is performed to determine whether all visible nodes in the user's logic design specification have been considered. If so, the FPGA technology mapping of the user's logic design is complete and the process (or at least the presently relevant portion of the process) ends. If not, control passes from step 542 to step 544.

In step 544 another visible node in the user's logic design specification is selected for consideration. Control then returns to step 512 where processing of the next visible node begins as described above for the preceding node.

From the foregoing it will be seen that the above-described method ensures or at least promotes the selection of an FPGA implementation of a user's design that can be readily and economically alternatively implemented in a structured ASIC if desired. For example, the above-described method tends to cause selection of an FPGA implementation that has the same visible nodes as will be visible in a structured ASIC implementation of the same logic design. In addition, the cost of that structured ASIC implementation will be reasonable, because consideration of its cost was built into the process for selecting the FPGA implementation.

Principles similar to those described above for the case in which an FPGA implementation is the immediate objective can be readily adapted for the case in which a structured ASIC implementation is the immediate objective. An example of modification of steps of the type shown in FIGS. 4*a*-4*c* for this latter case is shown in FIGS. 5*a*-5*c*. In other words, methods of the type illustrated by FIGS. 5*a*-5*c* can be used to facilitate the selection of a structured ASIC implementation of a user's logic design that can be readily, reliably, and economically migrated to an FPGA implementation that is functionally and operationally identical or as nearly identical as desired to the structured ASIC implementation.

In FIGS. 5*a*-5*c* steps that are identical or substantially identical to steps in FIGS. 4*a*-4*c* have reference numbers in FIGS. 5*a*-5*c* that are increased by 100 from the reference numbers of the corresponding steps in FIGS. 4*a*-4*c*. These steps will be self-explanatory in view of the text employed in them and the earlier discussion of the corresponding steps in the context of FIGS. 4*a*-4*c*. Accordingly, it will not be necessary to describe these steps again or additionally.

Steps in FIGS. 5*a*-5*c* that are only similar to steps in FIGS. 4*a*-4*c* have reference numbers in FIGS. 5*a*-5*c* that are increased by 200 from reference numbers of the somewhat similar steps in FIGS. 4*a*-4*c*. These are steps 722, 716, and 724 in FIG. 5*b* (respectively similar to earlier-described steps 522, 516 and 524). These steps can be described relatively briefly because they are at least conceptually similar to the generally corresponding earlier-described steps.

Note that as a result of step 620, a cut only remains under consideration if there is an already-known structured ASIC CHLE implementation of it. If there is such a known ASIC CHLE implementation, then step 722 is performed to compute or retrieve (from library data for the CHLE) an ORIGINAL_CHLE_METRIC value for that CHLE. As in the case of similar step 522 in FIG. 4*b*, the ORIGINAL_CHLE_METRIC value can take into account such costs of the CHLE as the number of HLEs required to implement the CHLE, the packing efficiency of the arrangement of HLEs in the CHLE, etc.

Following step 722, step 716 is performed to compute a LUT_METRIC value for an FPGA LUT implementation of the cut under consideration. (In this embodiment it is assumed that any cut that can be implemented by a library CHLE is small enough to be implemented by an FPGA LUT. Step 612 in FIG. 5*a* provides additional validation of this assumption.)

Step 716 may take into account such LUT cost factors as the number of inputs to the LUT that are used by the cut (which is a measure of how efficiently LUT resources of the FPGA are being used), signal delay that a LUT implementing the cut will cause, etc.

Following step 716, step 724 is performed to modify the ORIGINAL_CHLE_METRIC value from step 722 by the LUT_METRIC value from step 716. Similar to what is done in step 524 in FIG. 4*b*, step 724 shows an example in which NEW_LUT_METRIC is the sum of ORIGINAL_CHLE_METRIC multiplied by a weighting factor A and LUT_METRIC multiplied by a weighting factor 1-A. The parameter A in step 724 can have any value described above for the same or similar parameter in step 524.

It will be seen from the foregoing that the end result of the performance of a method such as is illustrated by FIGS. 5*a*-5*c* is selection of a structured ASIC implementation of a user's logic design that has an easily achieved, economical, and reliable alternative FPGA implementation with the same visible nodes as the structured ASIC implementation.

A method of the type shown in FIGS. 4*a*-4*c* can be combined with a method of the type shown in FIGS. 5*a*-5*c*, so that one software package can be used whether the initial objective is an FPGA implementation or a structured ASIC implementation.

Another aspect of the invention relates to providing machine-readable media (e.g., CD-ROM, magnetic tape, or the like) encoded with machine-readable instructions for performing any of the various methods of the invention as shown and described herein.

It will be understood that the foregoing is only illustrative of the principles of the invention, and that various modifications can be made by those skilled in the art without departing from the scope and spirit of the invention. For example, the maximum number (N) of inputs that a LUT is allowed to have may be different from what is generally assumed herein. Similarly, the maximum number of HLEs that a CHLE is allowed to have may be different from what is generally assumed herein. The FPGA and/or structured ASIC architectures that are considered in relation to one another in accordance with this invention may be different from the architectures generally assumed herein.

What is claimed is:

1. A method of selecting portions of a logic design for implementation in an FPGA having a predetermined FPGA architecture so as to facilitate possible conversion of the FPGA implementation to a structured ASIC implementation of said logic design in a structured ASIC having a predetermined structured ASIC architecture, said FPGA architecture employing multiple instances of programmable logic elements, and said structured ASIC architecture employing multiple instances of hard logic elements, each of which has less logic capacity than each of said programmable logic elements, comprising:

weighting candidate portions of the logic design with weightings that reflect both a first cost of implementing the candidate portion in one of the programmable logic elements and a second cost of implementing the candidate portion in a number of the hard logic elements needed to implement that candidate portion; and selecting from among the candidate portions finally selected portions of the logic design to be implemented in the FPGA based at least in part on the weightings of the candidate portions.

2. The method defined in claim 1 wherein the first cost includes consideration of a number of inputs to one of the programmable logic elements that the candidate portion requires for implementation in one of the programmable logic elements.

3. The method defined in claim 1 wherein the second cost includes consideration of whether or not a structured ASIC implementation for the candidate portion is already known in a library of known, structured ASIC implementations.

4. The method defined in claim 3 wherein, if a structured ASIC implementation for the candidate portion is already known in the library, the second cost includes consideration of a cost of that known structured ASIC implementation.

5. The method defined in claim 4 wherein the cost of the known structured ASIC implementation includes consideration of an amount of structured ASIC resources required for that known structured ASIC implementation.

6. The method defined in claim 5 wherein the consideration of an amount of structured ASIC resources required includes consideration of how many hard logic elements of structured ASIC circuitry are required.

7. The method defined in claim 5 wherein the cost of the known structured ASIC implementation further includes consideration of a packing efficiency of the structured ASIC resources required for the known structured ASIC implementation.

8. The method defined in claim 3 wherein, if a structured ASIC implementation for the candidate portion is not already known in the library, the second cost includes a penalty cost.

9. Machine-readable media encoded with machine-readable instructions for performing the method defined in claim 1.

* * * * *